United States Patent
Tan et al.

(10) Patent No.: US 7,974,117 B2
(45) Date of Patent: Jul. 5, 2011

(54) NON-VOLATILE MEMORY CELL WITH PROGRAMMABLE UNIPOLAR SWITCHING ELEMENT

(75) Inventors: Wei Tan, Bloomington, MN (US);
Nurul Amin, Woodbury, MN (US);
Insik Jim, Eagan, MN (US); Ming Sun, Eden Prairie, MN (US); Venu Vaithyanathan, Bloomington, MN (US);
YoungPil Kim, Eden Prairie, MN (US);
Chulmin Jung, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 20 days.

(21) Appl. No.: 12/497,964

(22) Filed: Jul. 6, 2009

(65) Prior Publication Data

US 2010/0110765 A1    May 6, 2010

Related U.S. Application Data

(60) Provisional application No. 61/109,606, filed on Oct. 30, 2008.

(51) Int. Cl.
*G11C 11/00* (2006.01)
(52) U.S. Cl. ........................... 365/148; 365/158
(58) Field of Classification Search .............. 365/148, 365/158
See application file for complete search history.

(56) References Cited

U.S. PATENT DOCUMENTS

| | | | |
|---|---|---|---|
| 6,456,524 B1 | 9/2002 | Perner et al. | |
| 7,060,586 B2 | 6/2006 | Li et al. | |
| 7,236,394 B2 | 6/2007 | Chen et al. | |
| 7,251,154 B2 | 7/2007 | Hush | |
| 7,286,378 B2 | 10/2007 | Nazarian | |
| 7,400,027 B2 | 7/2008 | Joung et al. | |
| 7,433,253 B2 | 10/2008 | Gogl et al. | |
| 7,632,279 B2 * | 12/2009 | Bastian | 606/88 |
| 2007/0195581 A1 * | 8/2007 | Morimoto | 365/148 |
| 2008/0107801 A1 * | 5/2008 | Celinska et al. | 427/96.7 |
| 2008/0272363 A1 * | 11/2008 | Mouli | 257/14 |
| 2008/0273370 A1 | 11/2008 | Keller et al. | |

* cited by examiner

*Primary Examiner* — Hoai V Ho
*Assistant Examiner* — Anthan T Tran
(74) *Attorney, Agent, or Firm* — Fellers, Snider, et al.

(57) ABSTRACT

A non-volatile memory cell with a programmable unipolar switching element, and a method of programming the memory element are disclosed. In some embodiments, the memory cell comprises a programmable bipolar resistive sense memory element connected in series with a programmable unipolar resistive sense switching element. The memory element is programmed to a selected resistance state by application of a selected write current in a selected direction through the cell, wherein a first resistance level is programmed by passage of a write current in a first direction and wherein a second resistance level is programmed by passage of a write current in an opposing second direction. The switching element is programmed to a selected resistance level to facilitate access to the selected resistance state of the memory element.

20 Claims, 7 Drawing Sheets

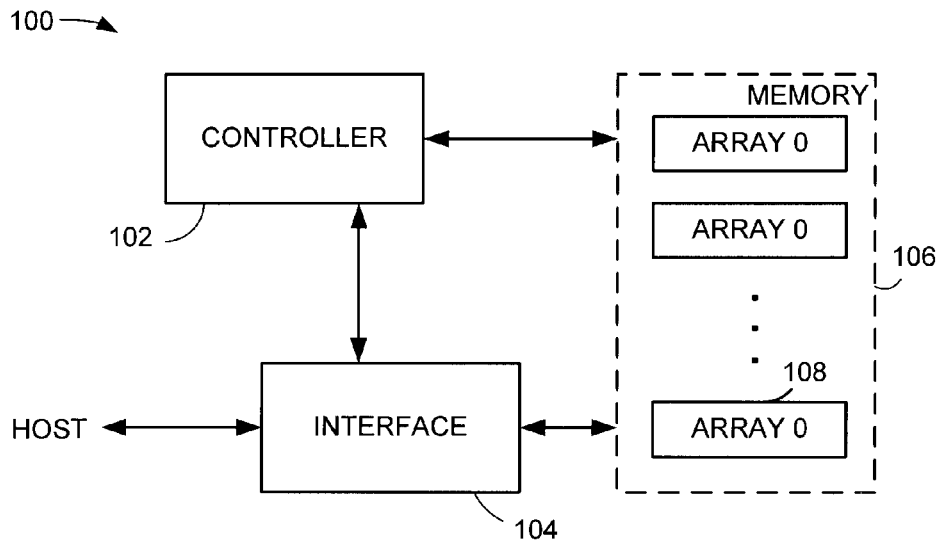
FIG. 1
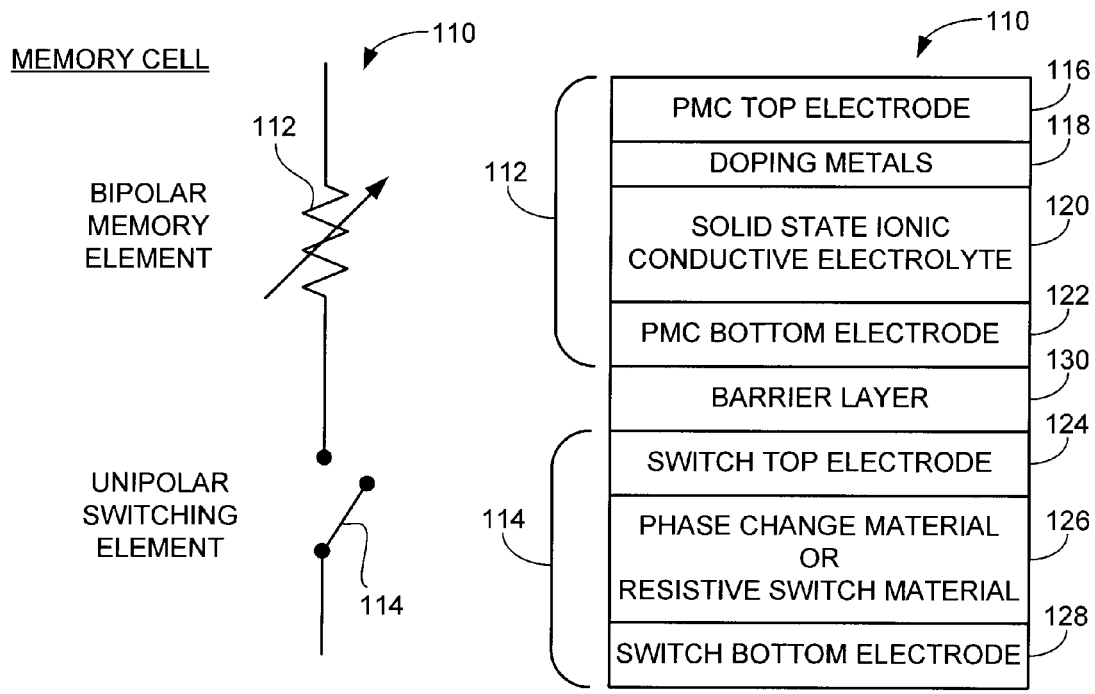
FIG. 2A
FIG. 2B

PMC CONSTRUCTION

RRAM CONSTRUCTION

PCRAM CONSTRUCTION

READ LOW RESISTANCE OF MEMORY ELEMENT

READ HIGH RESISTANCE OF MEMORY ELEMENT

NON-VOLATILE MEMORY CELL WITH PROGRAMMABLE UNIPOLAR SWITCHING ELEMENT

RELATED APPLICATIONS

This application makes a claim of domestic priority under 35 U.S.C.§119(e) to U.S. Provisional Patent Application No. 61/109,606 filed Oct. 30, 2008.

BACKGROUND

Data storage devices generally operate to store and retrieve data in a fast and efficient manner. Some storage devices utilize a semiconductor array of solid-state memory cells to store individual bits of data. Such memory cells can be volatile or non-volatile.

Volatile memory cells generally retain data stored in memory only so long as power continues to be supplied to the device, while non-volatile memory cells generally retain data storage in memory even in the absence of the application of power.

Some non-volatile memory cell constructions include a resistive sense memory element that can be programmed to different resistance states, such as a high resistance or a low resistance. Different logical states are assigned to the different resistance states of the cell, such as a logical 1 to the low resistance state and a logical 0 to the high resistance state. Such elements can be bipolar in that write currents to program the respective states are applied in opposite directions through the cell.

A switching device, such as a metal oxide semiconductor field effect transistor (MOSFET), may be incorporated into the memory cell to accommodate the bipolar memory element write currents. Such integrated switching devices can be relatively large with respect to the memory elements, and therefore the size of the switching devices can limit the ability to achieve higher data areal densities in a memory array.

SUMMARY

Various embodiments of the present invention are generally directed to a non-volatile memory cell, and a method of programming the memory cell.

In accordance with some embodiments, the non-volatile memory cell comprises a programmable bipolar resistive sense memory element connected in series with a programmable unipolar resistive sense switching element. The switching element is selectively programmed to facilitate access to a programmed state of the memory element.

In accordance with other embodiments, the method comprises providing a non-volatile memory cell comprising a programmable bipolar resistive sense memory element connected in series with a programmable unipolar resistive sense switching element. The memory element is programmed to a selected resistance state by application of a selected write current in a selected direction through the cell, wherein a first resistance state is programmed by passage of a write current in a first direction and wherein a second resistance state is programmed by passage of a write current in an opposing second direction. The switching element is programmed to a selected resistance state to facilitate access to the selected resistance state of the memory element.

These and other features and advantages which characterize the various embodiments of the present invention can be understood in view of the following detailed discussion and the accompanying drawings.

BRIEF DESCRIPTION OF THE DRAWINGS

FIG. 1 shows exemplary data storage device constructed and operated in accordance with various embodiments of the present invention.

FIGS. 2A-2B show exemplary configurations of a memory cell of an array of FIG. 1.

DETAILED DESCRIPTION

Figure 3A:
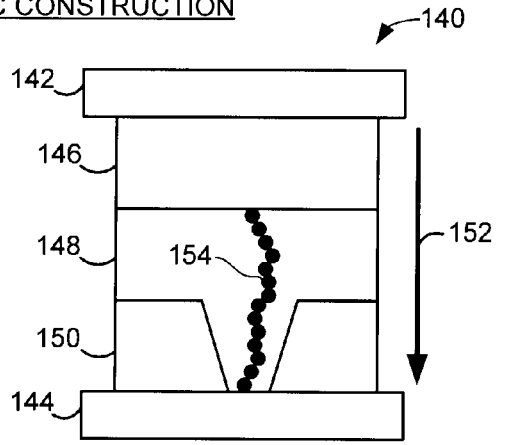
FIGS. 3A-3B show an exemplary programmable metallization cell (PMC) construction of the memory cell.

FIG. 1 provides a functional block representation of a data storage device 100 constructed and operated in accordance with various embodiments of the present invention. In some embodiments, the device 100 can be characterized as a non-volatile solid-state drive (SSD). Top level control of the device 100 is carried out by a suitable controller 102, which may be a programmable or hardware based microcontroller. The controller 102 communicates with a host device via a controller interface (I/F) circuit 104.

A memory space is shown at 106 to comprise a number of memory arrays 108 (denoted Arrays 0-N). Each array 108 comprises a block of non-volatile semiconductor memory of selected storage capacity.

An exemplary memory cell 110 of the memory space 106 is shown in FIG. 2A. In accordance with various embodiments, the memory cell 110 comprises a bipolar resistive sense memory element 112 coupled to a unipolar resistive sense switching element 114. The bipolar memory element 112 is selectively programmable to different resistance states (such as a high electrical resistance or a low electrical resistance) to store different logical values, such as a logical 0 or a logical 1. The resistance levels can alternatively be configured to store multiple bits; for example, programmable resistances $R1<R2<R3<R4$ of the memory element 112 can be used to respectively store bit values of 00, 01, 10 and 11.

The unipolar switching element 114 is also selectively programmable between a low resistance state and a high resistance state, and operates to facilitate access to the memory element 112 during write and read operations.

As used herein, the term "bipolar" describes an element that is programmed to different resistance states by the application of write currents of opposing polarity (opposing directions) through the element. The term "unipolar" describes an element that is programmed to different resistive states by the application of write currents of the same polarity (same direction) through the element.

As will be appreciated, some types of memory element constructions are bipolar in nature, others are unipolar in nature, and still others can be configured to operate in either mode. Thus, "bipolar" and "unipolar" as used herein will describe the actual modes in which the respective elements are affirmatively programmed during operation, irrespective of whether the elements could be programmed using a different mode.

As shown in FIG. 2B, the memory cell 110 can be arranged as a space efficient stack of semiconductor layers. In some embodiments, the memory element 112 is characterized as a programmable metallization cell (PMC). As shown in FIG. 2B, an exemplary PMC configuration includes a top electrode layer 116, a doping metals layer 118, a solid state ionic conductive electrolyte layer 120 and a bottom electrode layer 122. In alternative embodiments, the doping metals layer 118 can be placed between the electrolyte layer 120 and the bottom electrode layer 122.

In further embodiments, the unipolar switching element 114 comprises a phase change random access memory (PCRAM) or a resistive random access memory (ReRAM or RRAM). The exemplary switching element 114 in FIG. 2B includes a top electrode layer 124, a phase change material (in the case of PCRAM) or resistive switch material (in the case of RRAM) 126, and a bottom electrode layer 128. An intervening barrier layer 130 can be provisioned between the respective memory and switching elements 112, 114. In some embodiments, the switching element 114 can comprise a thin film layer such as $NiO_X$, $TiO_X$, $CuO_X$, $NbO_X$, $TaO_X$, or Nb:SrTiO$_3$.

The use of a memory cell construction made up of a bipolar memory element coupled to a unipolar switching element as shown in FIGS. 2A-2B provides a number of operational advantages. One such advantage is elimination of the need to incorporate an integrated switching element such as a MOSFET in each memory cell. This can facilitate significantly higher achievable data array densities, and reduced array connection and control complexities.

Figure 3B:
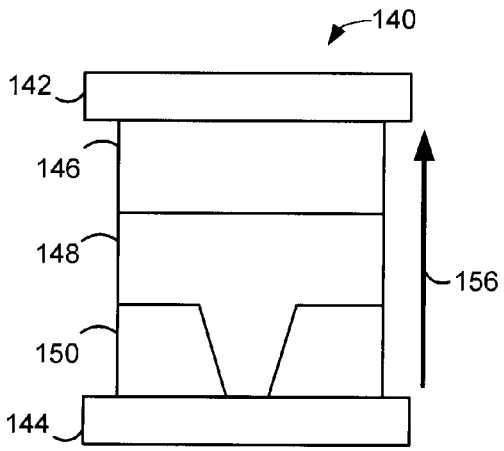

FIGS. 3A-3B illustrate an exemplary programmable metallization cell (PMC) element 140 suitable for use as the bipolar memory element 112 of FIG. 2A. The PMC element 140 includes top and bottom electrodes 142, 144, a metal layer 146, an electrolyte layer 148 and a dielectric layer 150. Control circuitry (not shown) can be used to adjust the relative voltage potential between the first and second electrodes 142, 144, resulting in passage of a write current 152 through the PMC element 140 to form a filament 154.

The filament 154 establishes an electrically conductive path between the metal layer 146 and the bottom electrode 144 by the migration of ions from the metal layer 166 and electrons from the bottom electrode 144. The dielectric layer 150 focuses a small area of electron migration from the bottom electrode 144 in order to control the position of the resulting filament 154. The filament reduces the effective resistance of the PMC element 140 to a relatively low resistance, which can be assigned a selected logical value such as logical 1.

Subsequent application of a write current 156 in a second direction through the PMC element causes migration of the ions and electrons back to the respective electrodes 142, 144, as shown in FIG. 3B. This resets the PMC element 140 to its initial high electrical resistance, which can be assigned a different logical value such as logical 0. PMC elements with a construction similar to that shown at 140 can alternatively be programmed using unipolar programming currents of different magnitudes and/or pulse widths.

Figure 4A:
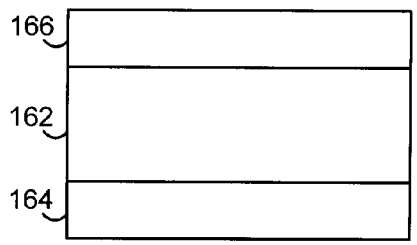
FIGS. 4A-4B show an exemplary resistive random access memory (RRAM) construction of the memory cell.
Figure 4B:
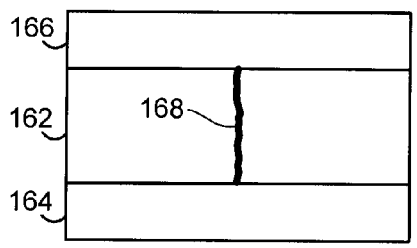

FIGS. 4A-4B provide an exemplary RRAM element 160 suitable for use as the bipolar memory element 112 and/or the unipolar switching element 114 of FIG. 2A. The RRAM element 160 includes a resistive storage layer 162 between respective electrode layers 164, 166. The storage layer 162 can be formed of a suitable oxide such as nickel oxide, $NiO_X$ and provides a normally high electrical resistance (e.g., logical 0). Application of a suitable voltage potential across the electrodes 164, 166 induces generation of a conductive filament 168 as shown in FIG. 4B. The filament 168 is formed by controlled metal migration (such as silver, Ag) from one electrode to the other. The filament 168 provides a low resistance state (e.g., logical 1).

The filament 168 can be subsequently retracted from the storage layer 162 by application of a suitable write current to the element. Some RRAM element configurations can provide retracted filaments by applying the write current in the same or opposite direction used to form the filament. Other RRAM element configurations provide and retract the filaments using currents of the same polarity, such as write currents of different magnitudes, pulse widths and/or voltages.

Figure 5A:
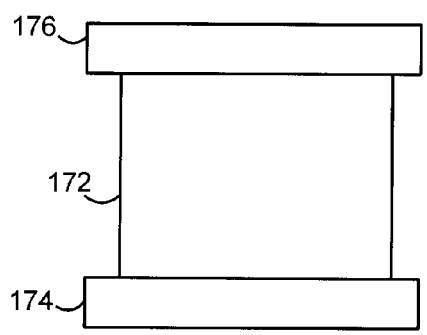
FIGS. 5A-5B show an exemplary phase change random access memory (PCRAM) construction of the memory cell.
Figure 5B:
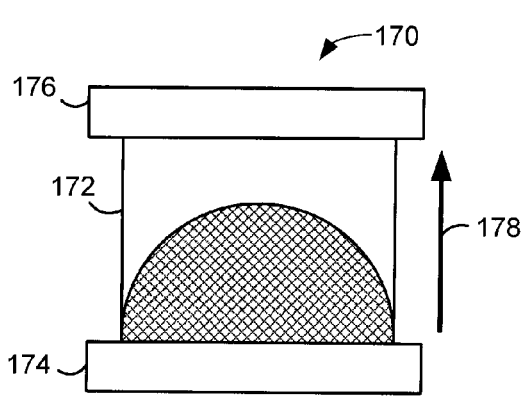

FIGS. 5A-5B provide an exemplary PCRAM element 170 (or "phase change element") suitable for use as the unipolar switching device 114 of FIG. 2A. The phase change element 160 includes a phase change layer 172 disposed between top and bottom electrodes 174, 176. The phase change layer 172 can be formed of a polycrystalline chalcogenide material of group VI of the periodic table, such as Tellurium (Te) and Selenium (Se). In some embodiments, the phase change layer 172 is formed of $Ge_2Sb_2Te_5$ (GST) or In—Ge—Te.

The phase change layer 172 transitions between crystallized and amorphous phases in response to joule heating caused by the passage of a suitable current through the element 170. To place the layer 172 into the amorphous phase, a relatively high voltage potential is applied across the electrodes 174, 176 to heat the layer 172 above its melting temperature. The voltage is removed rapidly so as to provide a relatively sharp cooling transition (referred to as a quenching process). In such case, the atoms may not have sufficient time to relax and fully array into a crystalline lattice structure, thereby ending in a metastable amorphous phase with a high resistance, as depicted in FIG. 5B.

The layer 172 is placed into the crystalline phase by applying a write current of relatively lower and longer duration. The applied pulse is configured to raise the temperature of the layer so as to be above its glass transition temperature and below its melting temperature, and to gradually decrease in temperature back to ambient level. This will generally provide sufficient dwell time for the material to crystallize, as depicted in FIG. 4A. Programming currents to place the layer 172 in the respective amorphous and crystalline phases can both be applied in a common direction (uniform polarity) 178.

Figure 6:
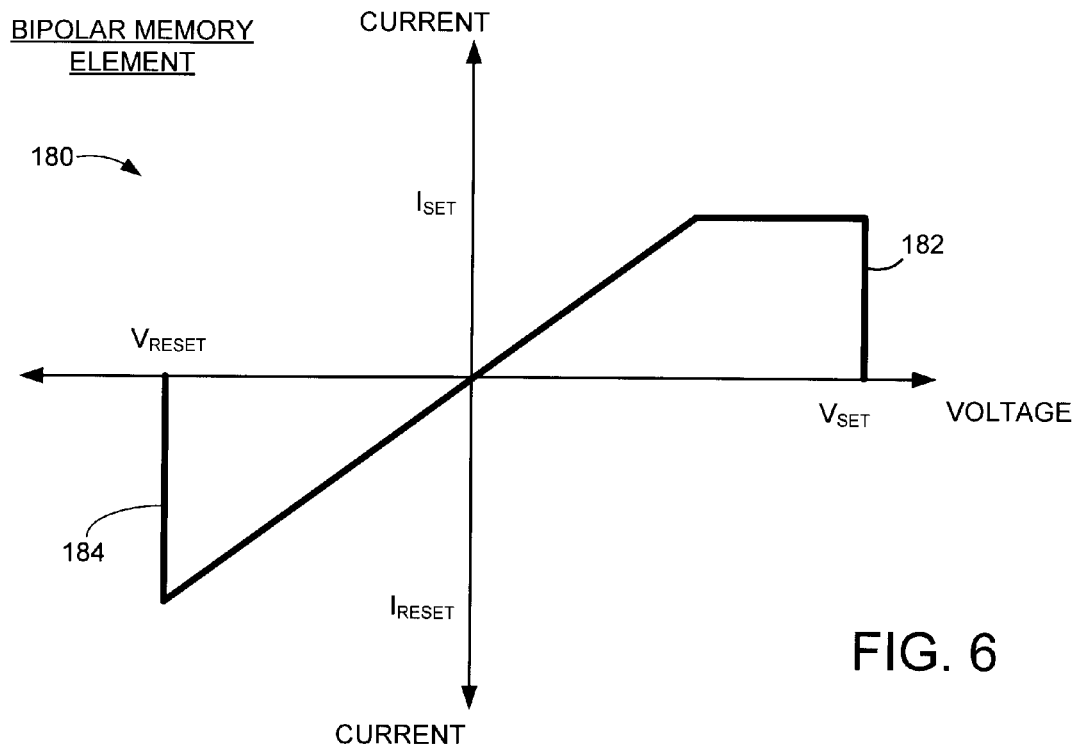
FIG. 6 provides a voltage-current (V-I) curve to selectively program a bipolar memory element of the memory cell of FIGS. 2A-2B.

FIG. 6 shows a voltage-current (V-I) curve 180 used to program the bipolar memory element 112 of FIG. 2A to different resistance states. A set portion 182 of the curve 180 is used to set the memory element 112 to a low resistance state, and requires application of voltage and current levels at or above the respective $V_{SET}$ and $I_{SET}$ levels.

A reset portion 184 of the curve 180 is used to reset the memory element 112 to a high resistance state. The reset portion 184 is of opposite polarity to the set portion 182 and involves the application of voltage and current levels at or above the respective $V_{RESET}$ and $I_{RESET}$ levels. An exemplary low resistance (set) value for the memory element 112 may be on the order of about $R_{MIN}$=2,000 to 3,000 ohms (2 KΩ-3 kΩ), and an exemplary high resistance (reset) value for the memory element 112 may be on the order of about $R_{MAX}$=1 MΩ ($10^6$Ω). Other values may be obtained depending on the construction and operation of the memory element.

Figure 7:
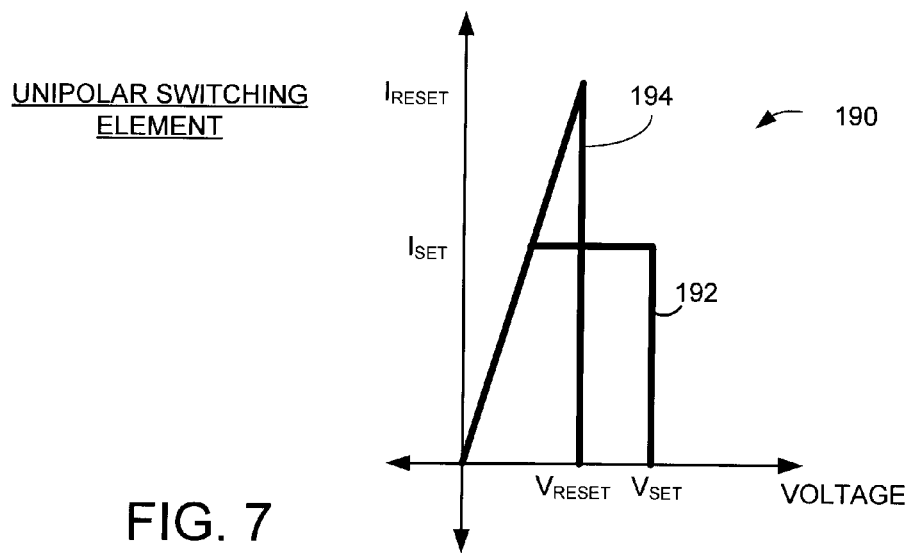
FIG. 7 shows a voltage-current (V-I) curve to selectively program a unipolar memory element of the memory cell of FIGS. 2A-2B.

FIG. 7 provides a corresponding V-I curve 190 used to selectively program the switching element 114 of FIG. 2A. A set portion 192 defines $V_{SET}$ and $I_{SET}$ values to set the resistance of the switching element 114 to the low resistance state. A reset portion 194 defines $V_{RESET}$ and $I_{RESET}$ values to set the resistance of the switching element 114 to the high resistance state. The $V_{RESET}$ and $I_{RESET}$ values are of the same polarity as the $V_{SET}$ and $I_{SET}$ values. Exemplary resistance values for the switching element 114 may be on the order of $R_{MIN}$=1 kΩ when in the set (closed) condition, and $R_{MAX}$=1 MΩ for the reset (open) condition.

For a given memory cell 110, the $V_{SET}$ level for the memory element 112 should be greater than the $V_{SET}$ level for the switching element 114, and the $I_{SET}$ and $I_{RESET}$ levels of the memory element 112 should be less than the $I_{RESET}$ level for the switching element 114. This will ensure that a write current to program a selected element of the memory cell does not inadvertently affect the programmed state of the other element in the memory cell.

It is contemplated that the unipolar direction of the write currents applied to the switching element 114 will be directed into the memory cell 110 so as to pass through the switching element 114 prior to passing through the memory element 112 (e.g., such as upwards from the bottom in FIGS. 2A-2B), although such is not necessarily required.

The bidirectional write currents will be in opposing directions, so that one direction will pass through the memory element 112 prior to the switching element 114 (such as down in FIGS. 2A-2B) and the other direction will pass through the switching element 114 prior to the memory element 112 (such as up in FIGS. 2A-2B). The relative physical orientations of the respective memory and switching elements 112, 114 can be selected to match the respective unipolar and bipolar write current requirements of these elements. For example, it may be desirable to place the active PMC electrode opposite the switching element 114 (e.g., layer 116 in FIG. 2B).

In some embodiments, the switching element 114 is programmed in relation to the programmed state of the memory element 112 at times when the memory cell 110 is not being accessed for a read or write operation. More specifically, when the memory element 112 is programmed high the switching element 114 may be programmed low, and when the memory element 112 is programmed low the switching element 114 may be programmed high. This will reduce leakage current since the overall resistance $R_{TOTAL}$ of a given cell will be at least equal the maximum resistance $R_{MAX}$ of one of the elements 112, 114 (e.g., 1 MΩ) plus the $R_{MIN}$ of the other element ($R_{TOTAL}=R_{MAX}+R_{MIN}>$1 MΩ).

In other embodiments, the switching element 114 can be placed in the reset condition (high resistance) at all times that the memory cell 110 is not being accessed. The switching element 114 can be placed into the set condition (low resistance) during the duration of an access operation, and thereafter returned to the reset condition (high resistance). This scheme can provide increased isolation and further reductions in leakage currents from adjacent cells.

In further embodiments, the memory cell structure 110 can be adapted such that data stored by the memory cell 110 are not only indicated by the resistive state of the memory element 112, but also by the resistive state of the switching element 114. For example, three state combinations for the elements 112, 114 could be defined as high/high, low/high and high/low. It will be noted that at least one state remains high in each of these combinations. Other variations will readily occur to the skilled artisan in view of the present disclosure.

Figure 8:
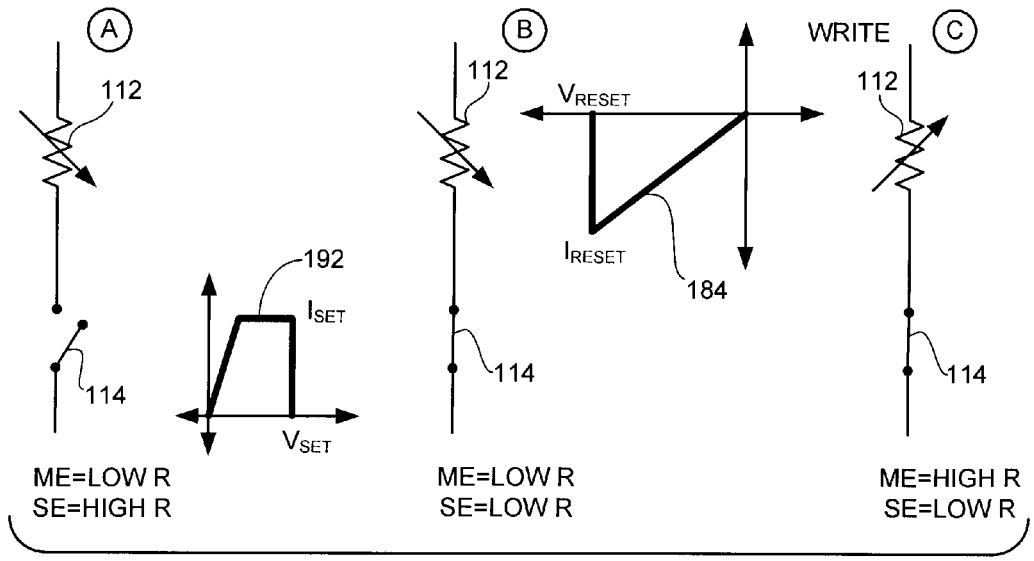
FIG. 8 illustrates an exemplary programming sequence to program the memory element to a high resistance state.

FIG. 8 provides a sequence of steps A-C carried out in some embodiments to program the memory element 112 to the high resistance state. The memory element (ME) 112 is initially in a low resistance state and the switching element (SE) is initially in a high resistance state (step A). The switching element 114 is set to the low resistance state at step B via application of the set portion 192 (FIG. 7). The memory element 112 is next programmed to the high resistance state at step C via the set portion 182 (FIG. 6). Although not shown in FIG. 8, as desired the switching element 114 can also be reset to the high resistance state by a subsequent application of the reset portion 194 of FIG. 7.

Figure 9:
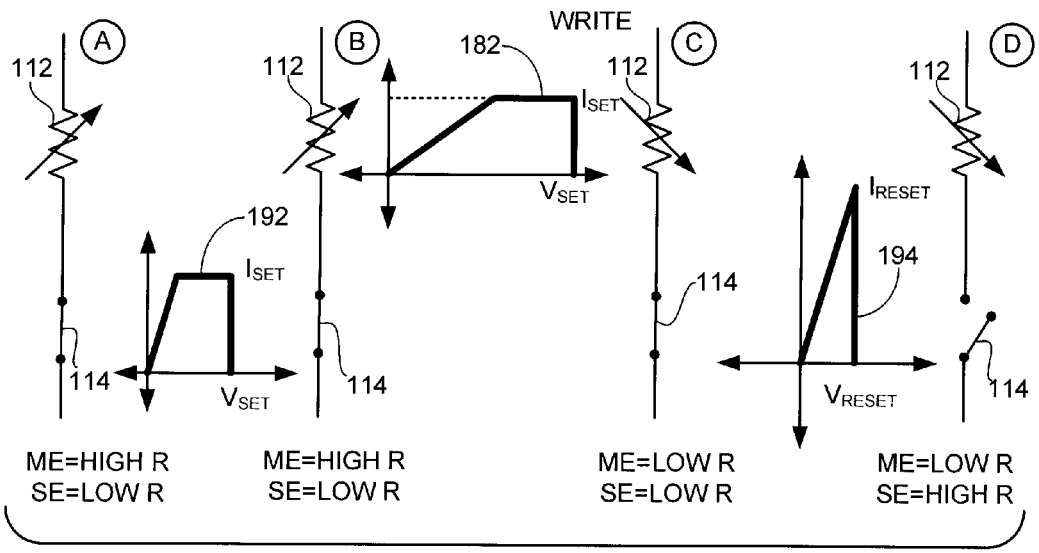
FIG. 9 illustrates an exemplary programming sequence to program the memory element to a low resistance state.

FIG. 9 provides a sequence of steps A-D carried out in some embodiments to set the memory element 112 to the low resistance state. Elements 112, 114 are initially in the high and low resistance states, respectively (step A). A set operation is carried out at step B to confirm the switching element 114 is in the low resistance state, although this leaves the memory cell unchanged. The memory element 112 is next set to low resistance (step C), and the switching element 114 is then reset to high resistance (step D).

Figure 10:
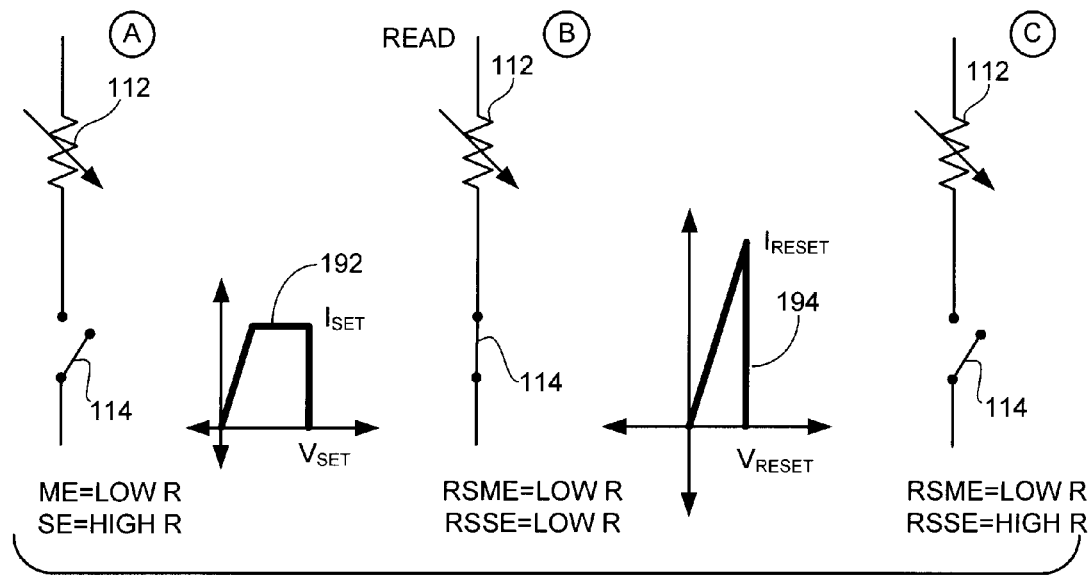
FIG. 10 provides an exemplary read sequence to read the memory element when programmed to the low resistance state.

FIG. 10 shows a sequence of steps A-C in accordance with some embodiments to sense a low resistance of the memory element 112. The initial resistances of the memory and switching elements 112, 114 are low and high, respectively (step A). The switching element 114 is set to low resistance and the resistance of the memory element 112 is sensed (read) at step B. The switching element 114 is thereafter returned to the high resistance state at step C.

Figure 11:
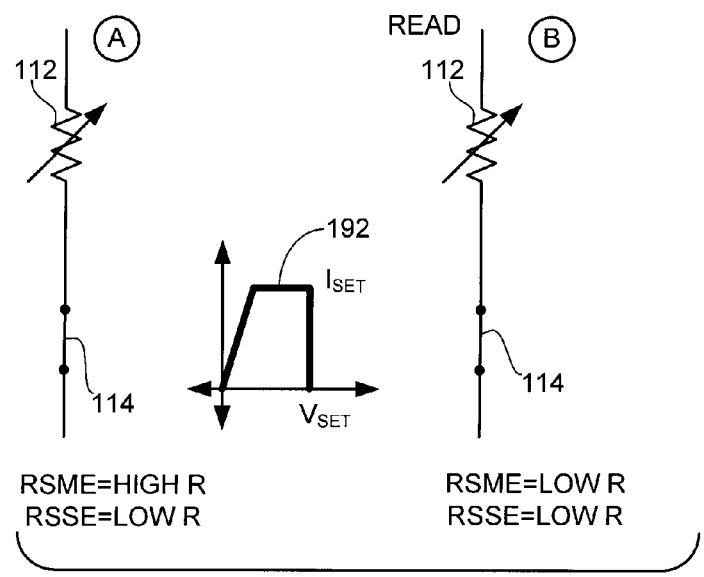
FIG. 11 provides an exemplary read sequence to read the memory element when programmed to the high resistance state.

FIG. 11 shows a sequence of steps A-B in accordance with some embodiments to sense a high resistance of the memory element 112. The initial state at step A is high resistance for the memory element 112 and low resistance for the switching element 114. A set operation is carried out to confirm placement of the switching element 114 into the low resistance state, after which the resistance of the memory cell is sensed (step B).

Figure 12:
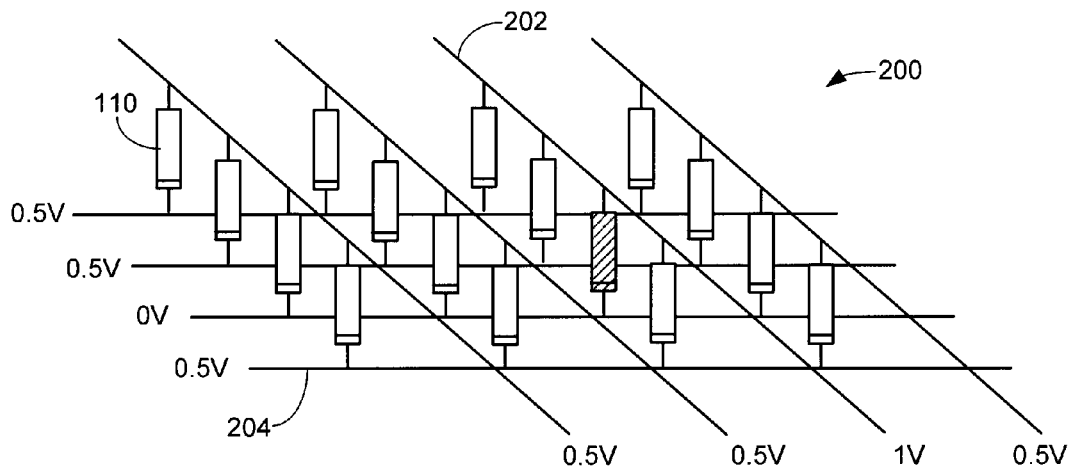
FIG. 12 is a schematic representation of a cross point array utilizing the memory cells of FIGS. 2A-2B.

FIG. 12 schematically depicts a cross-point array 200 formed from a number of the memory cells 110. The memory cells 110 are respectively connected between a first set of parallel upper control lines 202 and a lower set of parallel control lines 204. Access to individual cells 110, such as for a selected cell 110A (shown with cross-hatched pattern), can be carried out by setting the upper and lower control lines at the cross point of the selected cell to a selected voltage potential, such as 1.0V and 0V as shown.

The remainder of the upper and lower control lines 202, 204 are set to a different suitable value, such as a value that is half that of the applied potential (e.g., 0.5V as shown). This voltage differential will be sufficient to allow individual read and write access to the selected cell without interference from adjacent cells along the selected lines, and without inadvertently affecting the programmed state of such adjacent cells. This is because all cross points in the array will have high resistance (>$R_{MAX}$) due to the high resistance programmed state of the memory cell 112 or the switching device 114.

Figure 13:
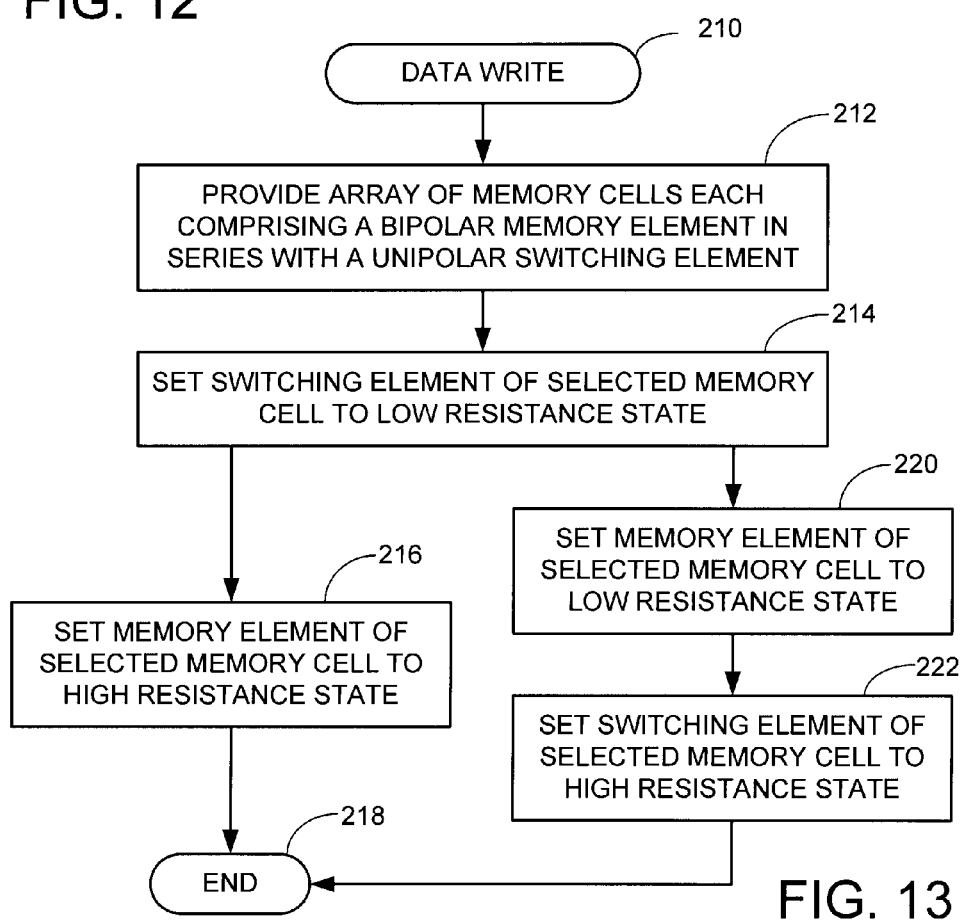
FIG. 13 is a WRITE ROUTINE illustrative of steps carried out in accordance with various embodiments of the present invention.

FIG. 13 sets forth a DATA WRITE routine 210 illustrative of various steps carried out in accordance with the foregoing discussion. An array of memory cells is initially provided at step 202 such as the cross point array 200 in FIG. 12. Each memory cell includes a bipolar memory element in series with a unipolar switching element, such as the elements 112, 114 discussed above. The memory element 112 is programmed to a desired programmed state by first setting the resistance of the switching element 114 to a low resistance state, step 204.

To write the memory element 112 to a high resistance state, the flow passes to step 206 where an appropriate write current is applied through the cell 110 in a first direction, after which the routine ends at step 208. To write the memory element 112 to a low resistance state, the flow alternatively passes to step 210 where an appropriate write current is applied in a second direction through the cell opposite the first direction. The switching element 114 is then placed in the high resistance state at step 212, and the routine ends at 208. As noted above, setting the switching element 114 to high resistance at step 212 ensures that at least one of the memory and switching elements is in the high resistive state at the conclusion of the access operation.

Figure 14:
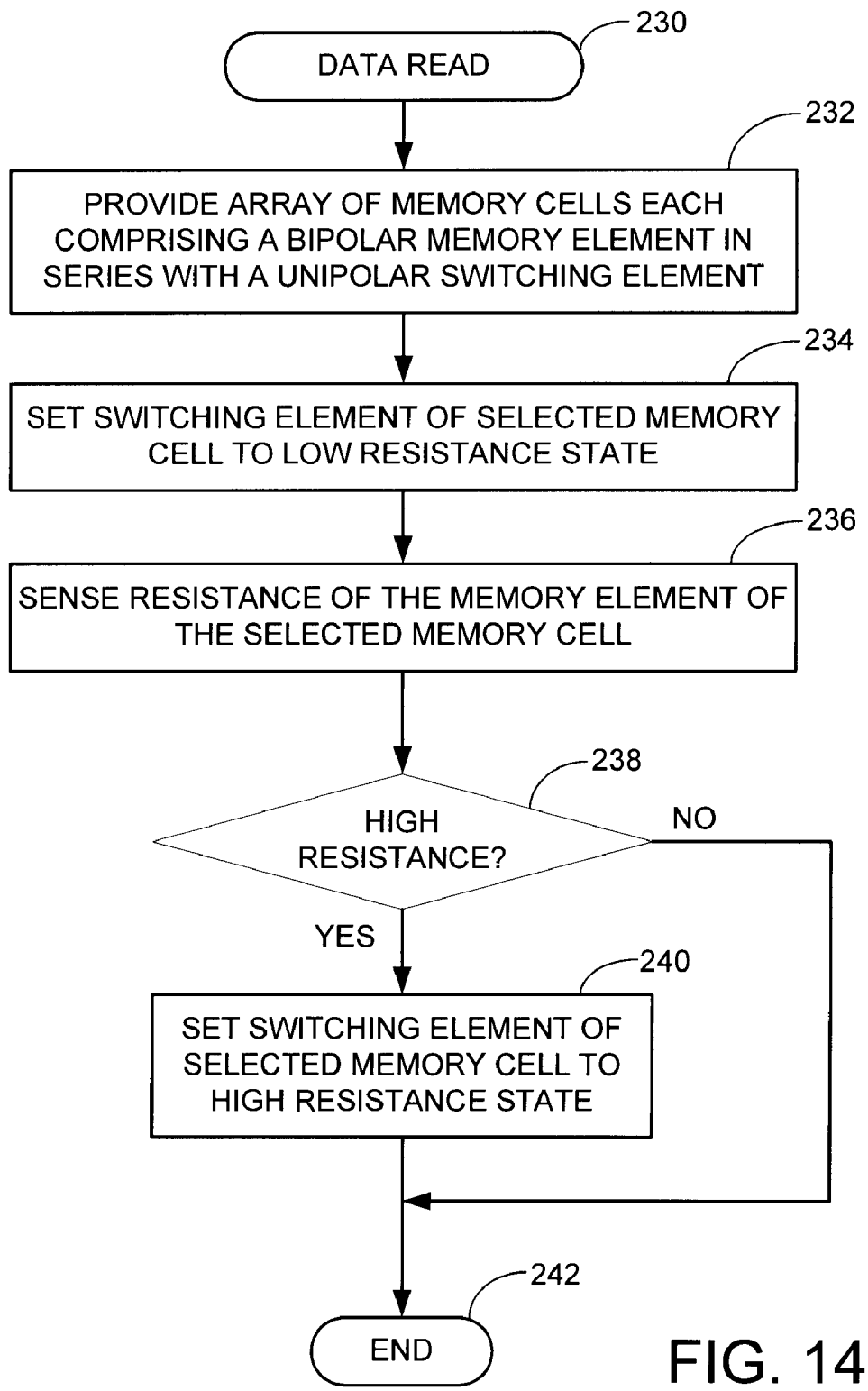
FIG. 14 is a READ ROUTINE illustrative of steps carried out in accordance with various embodiments of the present invention.

FIG. 14 sets forth a DATA READ routine 230 illustrative of steps carried out in accordance with the foregoing discussion. As with step 202 in FIG. 13, an array of memory cells is provided at step 232 with each memory cell 110 comprising a bipolar memory element such as 112 in series with a unipolar switching element such as 114.

A selected memory cell in the array is read by first applying an appropriate write current in the unipolar direction to set the resistance of the switching device 114 to the low resistance state, step 234. As noted above, this write current may be applied even if the switching device 114 is already in the low resistance (closed) condition, and thus serves to confirm this state of the switching device.

The resistance state of the memory element 114 is next sensed at step 236. This may be carried out by passing a read current through the cell and using a sense amplifier to sense the voltage drop across the cell. Decision step 238 determines whether the sensed resistance is a high resistance. If so, the routine ends at step 240, otherwise the flow passes to step 242 where the resistance of the switching element 114 is set to the high resistance.

A number of read schemes can be carried out during the read operation of step 236. With reference again to FIG. 12, in an N×N array of memory cells where voltages of 0.5V are applied to the non-selected upper and lower control lines 202, 204, let a voltage V1=0.5+ΔV represent the voltage applied to the upper control line 202 coupled to the selected memory cell, and a voltage V2=0.5−ΔV represent the voltage applied to the lower control line 204 coupled to the selected memory cell. When the memory element 112 is programmed to the low resistance $R_{MIN}$, the read current $I_{CELL}$ through the selected cell 110 will be:

$$I_{CELL} = \frac{2\Delta V}{R_{MIN}} + (N-1)\frac{\Delta V}{1M\Omega} \quad (1)$$

The read current $I_{CELL}$ through the selected cell 110 when the memory element 112 is programmed to the high resistance $R_{MAX}$ will be:

$$I_{CELL} = \frac{2\Delta V}{R_{MAX}} + (N-1)\frac{\Delta V}{1M\Omega} \quad (2)$$

Suitable sense circuitry can be provided to distinguish between the respective current magnitudes of equations (1) and (2) to determine the programmed state of the memory element 112.

As will be appreciated by one skilled in the art, the various embodiments illustrated herein provide a novel memory cell structure that can be efficiently programmed and sensed in a manner as described herein. The use of a bipolar memory element with a unipolar switching element allows for scaleable memory cells that can be reliably programmed with predetermined pulse profile sequences. The elimination of integrated switching devices such as MOSFETs reduces the complexity of the array by eliminating the need for separate source, bit and word lines to access the individual cells. A variety of different element constructions can be utilized, including but not limited to PMC, RRAM and PCRAM constructions for the respective memory and switching elements. It is contemplated that reduced power consumption levels and improved data throughput rates can also be achieved.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A non-volatile memory cell comprising a programmable bipolar resistive sense memory element connected in series with a programmable unipolar resistive sense switching element, wherein the switching element facilitates programming of the memory cell by application of a first current through the respective memory and switching elements in a first direction to program the switching element in a low resistance state, followed by application of a second current through the respective memory and switching elements in an opposing second direction to program the memory element in a selected resistance state, wherein the memory cell is adapted to store at least three distinct data states in relation to the memory and switching elements being programmed in resistance states of high/high, low/high and high/low, respectively.

2. The memory cell of claim 1, wherein the switching element is axially aligned with the memory element and the switching and memory elements are each characterized as a two terminal semiconductor stack.

3. The memory cell of claim 1, in which the selected resistance state is characterized as a low resistance state and the memory element is further programmed by application of a third current through the respective memory and switching elements in said first direction to place the switching element in a high resistance state.

4. The memory cell of claim 1, in which the selected resistance state is characterized as a high resistance state and the memory element is maintained in the low resistance state at a conclusion of said programming of the memory cell.

5. The memory cell of claim 1, wherein the memory element is characterized as a programmable metallization cell (PMC) comprising opposing first and second conductive layers and an intervening a solid state ionic conductive electrolyte layer through which a conductive filament is formed by the first current.

6. The memory cell of claim 1, wherein the switching element is characterized as a resistive random access memory (RRAM) cell adapted to form a conductive filament that extends through a separation layer between two conductive layers responsive to the first current pulse.

7. The memory cell of claim 1, wherein the switching element comprises a phase change layer that transitions between an amorphous phase and a crystalline phase responsive to said first current passing through the phase change layer.

8. The memory cell of claim 1, wherein the switching element is characterized as a non-volatile memory element.

9. A method comprising:
providing a non-volatile memory cell comprising a programmable bipolar resistive sense memory element connected in series with a programmable unipolar resistive sense switching element; and
programming the memory cell by applying a first current pulse through the respective memory and switching elements to set the switching element to a low resistance state, followed by applying a second current pulse through the respective memory and switching elements to set the memory element to a selected resistance state, followed by applying a third current pulse through the respective memory and switching elements to set the switching element to a high resistance state, said first and third current pulses being applied in a common direction through the cell, wherein the memory cell is adapted to store at least three distinct data states in relation to the memory and switching elements being programmed in selected resistance states of high/high, low/high and high/low, respectively.

10. The method of claim 9, wherein the switching element is axially aligned with the memory element and the switching and memory elements are each characterized as a two terminal semiconductor stack.

11. The method of claim 9, wherein the memory element is characterized as a programmable metallization cell (PMC) comprising opposing first and second conductive layers and an intervening a solid state ionic conductive electrolyte layer through which a conductive filament is formed by the first current.

12. The method of claim 9, wherein the switching element is characterized as a resistive random access memory (RRAM) cell adapted to form a conductive filament across a separation layer between two conductive layers responsive to the first current pulse.

13. The method of claim 9, wherein the switching element comprises a phase change layer that transitions between an amorphous phase and a crystalline phase responsive to the first current pulse.

14. The method of claim 9, wherein the switching element comprises a thin film layer of $NiO_x$, $TiO_x$, $CuO_x$, $NbO_x$, $TaO_x$, or $Nb:SrTiO_3$.

15. The method of claim 9, wherein the selected resistance state of the memory cell is a high resistance state.

16. The method of claim 9, wherein the selected resistance state of the memory cell is a low resistance state.

17. A method comprising:
storing a selected data value to a non-volatile memory cell comprising a programmable bipolar resistive sense memory element connected in series with a programmable unipolar resistive sense switching element;
sequentially applying a first write current through the respective memory and switching elements to set the switching element to a low resistance state and a read current through the respective memory and switching elements to establish a voltage drop across the memory cell;
sensing the selected data value in relation to the voltage drop; and
applying a second write current through the respective memory and switching elements to set the switching element to a high resistance state responsive to the sensed selected data value indicating the memory element is programmed to a low resistance state, the first and second write currents applied in a common direction through the cell, wherein the memory cell is adapted to store at least three distinct data states in relation to the memory and switching elements being programmed in respective resistance states of high/high, low/high and high/low.

18. The method of claim 17, in which the method further comprises maintaining the switching element in said low resistance state responsive to the sensed selected data value indicating the memory element is programmed to a high resistance state.

19. The method of claim 17, in which the first write current and the second write current have different respective pulse widths and durations to transition the switching device between an amorphous phase and a crystalline phase.

20. The method of claim 17, in which the storing step comprises sequentially applying said first and second write currents to the respective memory and switching elements to respectively set and reset the programmed resistance of the switching device, and applying a third write current therebetween to set the programmed resistance of the memory element.

* * * * *